(12) United States Patent
Yen et al.

(10) Patent No.: US 11,322,468 B2
(45) Date of Patent: May 3, 2022

(54) SEMICONDUCTOR DEVICE INCLUDING METAL HOLDER AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/860,877

(22) Filed: Apr. 28, 2020

(65) Prior Publication Data

US 2021/0335742 A1 Oct. 28, 2021

(51) Int. Cl.
*H01L 23/00* (2006.01)

(52) U.S. Cl.
CPC .............. *H01L 24/13* (2013.01); *H01L 24/11* (2013.01); *H01L 2224/10135* (2013.01); *H01L 2224/11003* (2013.01); *H01L 2224/11015* (2013.01); *H01L 2224/11849* (2013.01); *H01L 2224/13026* (2013.01); *H01L 2224/13147* (2013.01)

(58) Field of Classification Search
CPC ...................... H01L 24/13; H01L 24/11; H01L 2224/10135; H01L 2224/11003; H01L 2224/11015; H01L 2224/11849; H01L 2224/13026; H01L 2224/13147
USPC ............................................ 257/737; 438/613
See application file for complete search history.

(56) References Cited

U.S. PATENT DOCUMENTS

| | | | |
|---|---|---|---|
| 10,157,821 B1 | 12/2018 | Liu | |
| 2001/0045668 A1* | 11/2001 | Liou | H01L 23/49816 257/778 |
| 2015/0162292 A1* | 6/2015 | Machida | H01L 24/11 257/737 |
| 2018/0286830 A1* | 10/2018 | Yu | H01L 24/13 |

* cited by examiner

*Primary Examiner* — Didarul A Mazumder
(74) *Attorney, Agent, or Firm* — Foley & Lardner LLP

(57) ABSTRACT

A semiconductor device and a method of manufacturing the same are provided. The semiconductor device includes a substrate and a metal holder. The substrate includes at least one bonding pad disposed adjacent to its surface and the metal holder is disposed adjacent to the bonding pad.

20 Claims, 14 Drawing Sheets

SEMICONDUCTOR DEVICE INCLUDING METAL HOLDER AND METHOD OF MANUFACTURING THE SAME

BACKGROUND

1. Technical Field

The present disclosure relates to a semiconductor device and a method of manufacturing the same, and more particularly, to a semiconductor device that can shorten the distance between electrical connections.

2. Description of the Related Art

Nowadays, techniques for minimizing the dimensions of a semiconductor device and at the same time increasing the number of electrical connections (i.e., higher I/Os) of the device are under progressively development. Therefore, it would be desirable to provide a semiconductor device with more reliable electrical connections where the semiconductor device can function properly or can achieve the required performances and at the same time satisfy the miniaturization requirement.

SUMMARY

In an aspect, a semiconductor device includes a substrate and a metal holder. The substrate includes at least one bonding pad disposed adjacent to its surface and the metal holder is disposed adjacent to the bonding pad.

In an aspect, a semiconductor device includes a substrate and a metal element. The substrate includes at least one bonding pad disposed adjacent to its surface. The metal element is disposed adjacent to the bonding pad and adapted to fit a metal holder disposed adjacent to a surface of a second substrate.

In an aspect, a method of manufacturing a semiconductor device includes: disposing an insulation layer on a carrier; disposing at least two metal holder materials on the insulation layer, wherein the two metal holder materials are spaced from each other by a distance; aligning the two metal holder materials to a bonding pad disposed adjacent to a surface of a substrate; and bonding the two metal holder materials to the bonding pad.

DETAILED DESCRIPTION

Spatial descriptions, such as "top" and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides a semiconductor device including a substrate and a metal holder. The substrate includes at least one bonding pad disposed adjacent to its surface and the metal holder is disposed adjacent to the bonding pad. The metal holder is configured in a manner that a higher number of electrical connections (i.e., higher I/Os) can be obtained without compromising the robust electrical connections.

Figure 1:
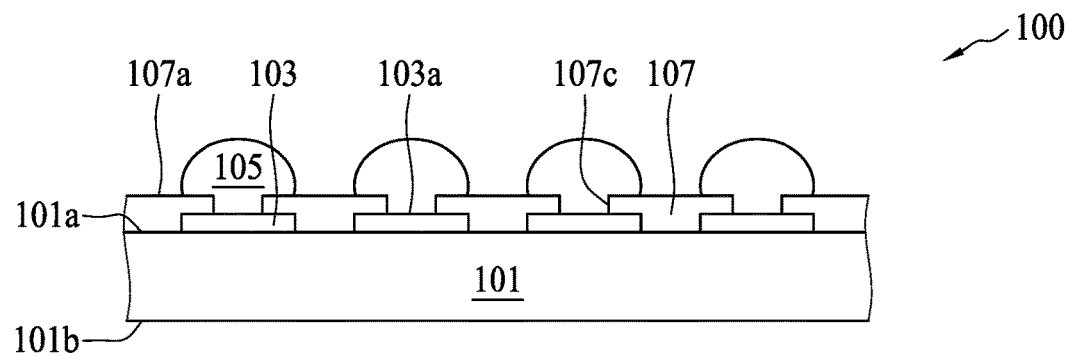
FIG. 1 illustrates a cross-sectional view of a semiconductor device according to some embodiments of the present disclosure.

FIG. 1 illustrates a cross-sectional view of a semiconductor device according to some embodiments of the present disclosure. The semiconductor device 100 of FIG. 1 includes a first substrate 101 and a solder bump 105.

The first substrate 101 has a first top surface 101a and a second bottom surface 101b opposite to the first top surface 101a. The first substrate 101 may be a die, a chip, a package, an interposer, a printed circuit board, or a combination thereof. In some embodiments, the first substrate 101 is a printed circuit board. In some embodiments, the first substrate 101 is a die. The first substrate 101 may include at least one first bonding pad 103. The first bonding pad 103 may be disposed adjacent to the first top surface 101a of the first substrate 101. In some embodiments, the first bonding pad 103 is disposed on (e.g., physical contact or embedded in and exposed by) the first top surface 101a of the first substrate 101. The first bonding pad 103 may be, for example, a contact pad of a trace or a ball pad. In some embodiments, the first bonding pad 103 is a ball pad.

The solder bump 105 is disposed adjacent to the first top surface 101a of the first substrate 101. In some embodiments, the solder bump 105 electrically connects to the first bonding pad 103. In some embodiments, the solder bump 105 is disposed on (e.g., in physical contact with) the first bonding pad 103. The solder bump 105 may be a solder ball, a portion of a solder ball, have a semi-ball-like shape, or circular arc so the contact surface to an electrical connector (e.g., a solder bump) can be enlarged, which may improve the subsequent electrical bonding process capability for connecting to the electrical connector as it may provide more bonding surface to accommodate a deviated electrical connector. In addition, it may reduce the occurrence of solder breakage between the solder bump 105 and the corresponding electrical connector as it may provide more bonding surface area. In some embodiments, the solder bump 105 is a solder ball.

The semiconductor device 100 may include a first insulation layer 107. The first insulation layer 107 may be disposed adjacent to the first top surface 101a of the first substrate 101. In some embodiments, the first insulation layer 107 is disposed on (e.g., in physical contact with) the first top surface 101a of the first substrate 101. In some embodiments, the first insulation layer 107 is disposed adjacent to the first bonding pad 103. The first insulation layer 107 may define an opening 107c exposing at least a portion of the first bonding pad 103. In some embodiments, the solder bump 105 is disposed in the opening 107c and extends over a portion of the first insulation surface 107a of the first insulation layer 107, which may provide more process capability for the subsequent bonding process to an electrical connector as it may provide more bonding surface area.

The first insulation layer 107 may include, for example, one of, or a combination of, a photosensitive material (e.g., polyimide (PI), polyamide (PA), or other suitable materials), an epoxy material, a resin material (e.g., Ajinomoto Build-up Film (ABF)), cyclophentadiene (CPD), poly-p-phenylene benzobisoxazole (PBO), a solder mask material, a fiber, and an inorganic material (e.g., $Ta_2O_5$, $SiO_2$, $Si_3N_4$, or other suitable materials). In some embodiments, the first insulation layer 107 includes PA.

Figure 2:
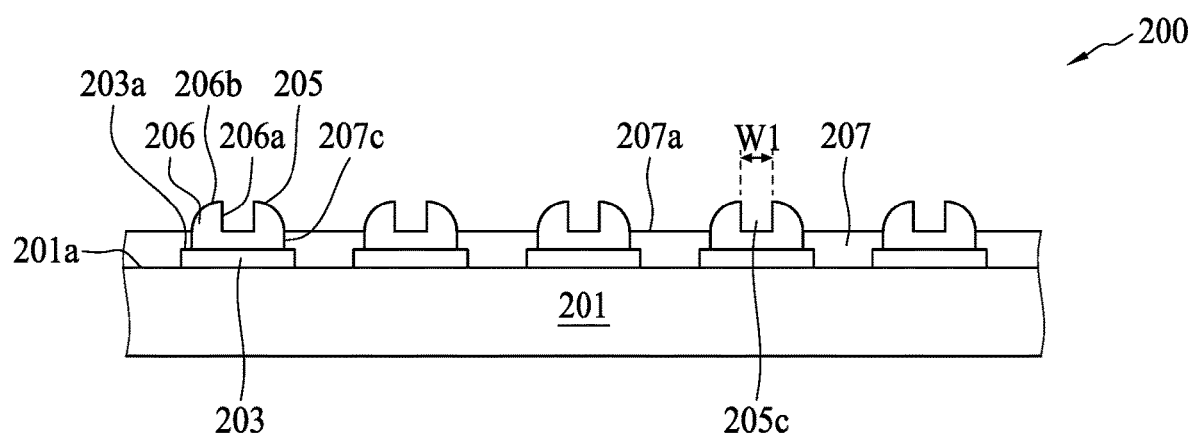
FIG. 2 illustrates a cross-sectional view of a semiconductor device according to some embodiments of the present disclosure.

FIG. 2 illustrates a cross-sectional view of a semiconductor device according to some embodiments of the present disclosure. The semiconductor device 200 illustrated in FIG. 2 is similar to that illustrated in FIG. 1 with a difference including that a metal holder 205, rather than a solder bump 105 is disposed adjacent to the first top surface 201a of the first substrate 201.

The metal holder 205 may be disposed in the opening 207c defined by the first insulation layer 207. The metal holder 205 may be disposed within the opening 207c defined by the first insulation layer 207. That is, the metal holder 205 may not extend over the first insulation surface 207a of the first insulation layer 207. By providing the metal holder 205 as locating within the opening 207c of the first insulation layer 207, a potential contamination problem caused during the formation of the solder bump 105 as illustrated in FIG. 1, such as solder overflowing over the first insulation surface 107a of the insulation layer 107 may be eliminated. Moreover, since the metal holder 205 may be confined within a limited space (i.e., within the opening 207c defined by the first insulation layer 207), the pitch between the first bonding pads 203 may be further reduced as less space is required to accommodate the metal holder 205. As a result, more bonding pads can be included in the same area, which may in turn increase the electrical connecting density. Furthermore, since the metal holder 205 may be disposed within the opening 207c of the first insulation layer 207, a potential short circuit problem caused by the expansion of the solder bump 105 over the first insulation surface 107a of the first insulation layer 107 as illustrated in FIG. 1 may be eliminated.

In some embodiments, the metal holder 205 electrically connects to the first bonding pad 203. In some embodiments, the metal holder 205 is disposed on (e.g., in physical contact with) the first bonding pad 203. The metal holder 205 may have a cavity 205c. The cavity 205c may have a width W1. The first bonding pad 203 may be exposed by the cavity 205c of the metal holder 205 or covered by the metal holder 205. In some embodiments, the cavity 205c locates at about the center of the metal holder 205. The metal holder 205 may have a sidewall 206 disposed adjacent to the edge of the first bonding pad 203. The sidewall 206 of the metal holder 205 has an inner surface 206a and an outer surface 206b opposite to the inner surface 206a. The sidewall 206 of the metal holder 205 may be curved (slopes at one end) or substantially perpendicular to a bonding surface 203a of the bonding pad 203. One or both of the inner surface 206a and the outer surface 206b of the sidewall 206 of the metal holder 205 slopes down toward the first top surface 201a of the first substrate 201. One or both of the inner surface 206a and the outer surface 206b of the sidewall 206 of the metal holder 205 is substantially perpendicular to the bonding surface 203a of the bonding pad 203. In some embodiments, the outer surface 206b of the sidewall 206 of the metal holder 205 slopes down toward the first top surface 201a of the first substrate 201 and the inner surface 206a is substantially perpendicular to the bonding surface 203a of the bonding pad 203. In some embodiments, the metal holder 205 has a cavity 205c. In some embodiments, the metal holder 205 has a pincer-like shape. In some embodiments, the cavity 205c of the metal holder 205 has a cup-like shape.

The metal holder 205 may include solder, copper, another metal, a metal alloy, or a combination thereof. In some embodiments, the metal holder 205 includes solder.

By providing a metal holder 205 as having a cavity 205c, the alignment of a corresponding electrical connector to the metal holder 205 may become easier. As a result, since the metal holder 205 and the corresponding electrical connector can be well aligned to each other and connected, metal breakage due to the misalignment and displacement connection between them may be eliminated.

Figure 3:
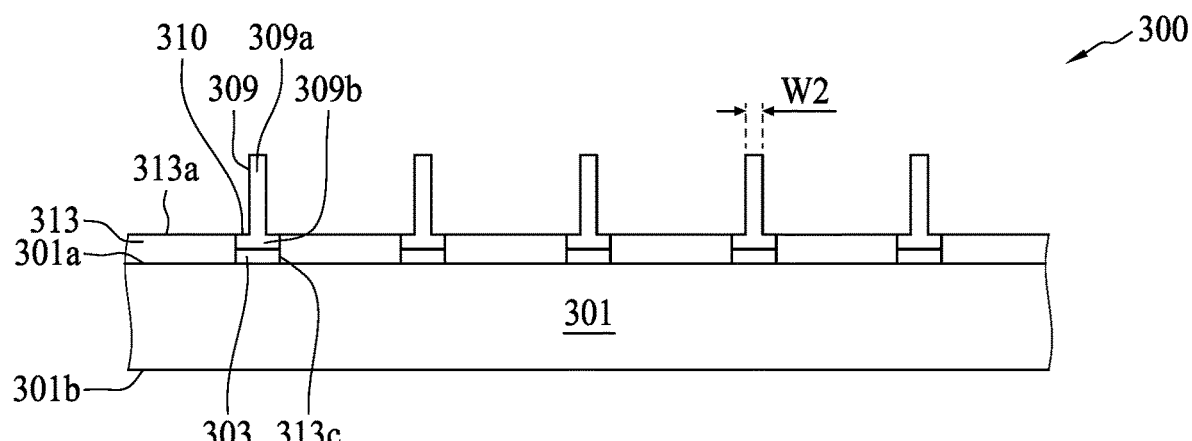
FIG. 3 illustrates a cross-sectional view of a semiconductor device according to some embodiments of the present disclosure.

FIG. 3 illustrates a cross-sectional view of a semiconductor device according to some embodiments of the present disclosure. The semiconductor device 300 of FIG. 3 includes a second substrate 301 and a metal element 309.

The second substrate 301 has a second top surface 301a and a second bottom surface 301b opposite to the second top surface 301a. The second substrate 301 may be a wafer, a die, a chip, a package, an interposer, a printed circuit board, or a combination thereof. In some embodiments, the second substrate 301 is a wafer. In some embodiments, the second substrate 301 is a die. The second substrate 301 may include at least one second bonding pad 303. The second bonding pad 303 may be disposed adjacent to the second top surface 301a of the second substrate 301. In some embodiments, the second bonding pad 303 is disposed on (e.g., physical contact or embedded in and exposed by) the second top surface 301a of the second substrate 301. The second bonding pad 303 may be, for example, a contact pad of a trace or a ball pad. In some embodiments, the second bonding pad 303 is a ball pad.

The metal element 309 is disposed adjacent to the second top surface 301a of the second substrate 301. The metal element 309 is disposed adjacent to the second bonding pad 303. In some embodiments, the metal element 309 electrically connects to the second bonding pad 303. In some embodiments, the metal element 309 is disposed on (e.g., in physical contact with) the second bonding pad 303.

The metal element 309 is adapted to fit a metal holder 205 disposed adjacent to a first top surface 201a of a first substrate 201, such as the one illustrated in FIG. 2. The metal element 309 may include a narrower end 309a and a wider end 309b. The narrower end 309a may have a second width W2. The narrower end 309a should be adapted to fit the metal holder 205 disposed adjacent to the first top surface 201a of the first substrate 201. The second width W2 of the narrower end 309a of the metal element 309 should be equal to or smaller than the first width W1 of the cavity 205c of the metal holder 205 so the cavity 205c of the metal holder 205 may accommodate the narrower end 309a of the metal element 309 properly. In addition, since the width of the metal element 309 is designed in accordance with the width of the corresponding cavity 205c of the metal holder 205, which can be reduced compared to a solder/stud bump such as the one illustrated in FIG. 1, the pitch between the second bonding pads 303 can be reduced. As a result, the electrical connection density may be increased because more space may be produced to accommodate more bonding pads.

The narrower end 309a of the metal element 309 may protrude from the second insulation surface 313a of the second insulation layer 313. In some embodiments, the narrower end 309a of the metal element 309 has substantially equal width W2 from top to the bottom. In some embodiments, the narrower end 309a of the metal element 309 has a column-like shape.

The wider end 309b of the metal element 309 may have a surface 310 in substantially the same plane with the second insulation surface 313a of the second insulation layer 313. In some embodiments, the wider end 309b of the metal element 309 is embedded in and exposed by the second insulation layer 313. The metal element 309 may have a T-like shape or a hammer-like shape.

The narrower end 309a and wider end 309b of the metal element 309 may include the same or different material. In some embodiments, the narrower end 309a and wider end 309b of the metal element 309 include the same material. In some embodiments, the narrower end 309a and wider end 309b of the metal element 309 are formed integrally. The narrower end 309a and wider end 309b of the metal element 309 may independently include solder, copper, another metal, a metal alloy, or a combination thereof. In some embodiments, the narrower end 309a and wider end 309b of the metal element 309 include solder and formed integrally.

Figure 4:
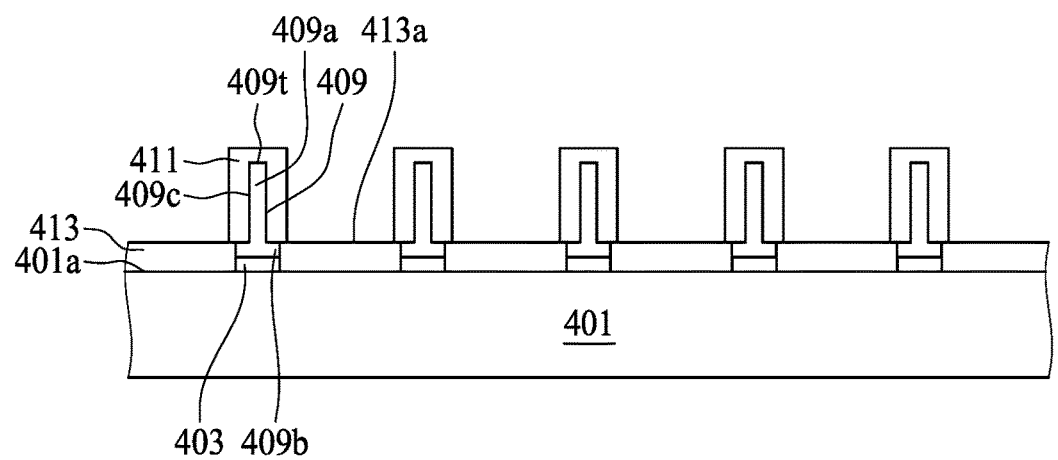
FIG. 4 illustrates a cross-sectional view of a semiconductor device according to some embodiments of the present disclosure.

FIG. 4 illustrates a cross-sectional view of a semiconductor device according to some embodiments of the present disclosure. The semiconductor device 400 illustrated in FIG. 4 is similar to that illustrated in FIG. 3 with a difference including that at least a portion of a sidewall 409c of the metal element 409 is surrounded by a first metal layer 411.

The first metal layer 411 is disposed adjacent to the second insulation surface 413a of the second insulation layer 413. In some embodiments, the first metal layer 411 is disposed on (e.g., in physical contact with) the second insulation surface 413a of the second insulation layer 413. The first metal layer 411 surrounds at least a portion of the sidewall 409c of the metal element 409. In some embodiments, the first metal layer 411 surrounds the entire sidewall 409c of the metal element 409. In some embodiments, the cavity 205c of the corresponding metal holder 205 such as the one illustrated in FIG. 2 has a width no less than that of the metal element 409 and the first metal layer 411. The first metal layer 411 may cover at least a portion of the top surface 409t of the metal element 409. In some embodiments, the first metal layer 411 covers the top surface 409t of the metal element 409 entirely. In some embodiments, the narrower end 409a of the metal element 409 is embedded in the first metal layer 411. In some embodiments, the narrower end 409a of the metal element 409 is covered by the first metal layer 411 entirely.

The narrower end 409a and wider end 409b of the metal element 409 and the first metal layer 411 may include the same or different material. In some embodiments, the narrower end 409a and the first metal layer 411 include different material. In some embodiments, the narrower end 409a and wider end 409b of the metal element 409 include the same material, and the narrower end 409a of the metal element 409 and the first metal layer 411 include different material. The first metal layer 411 may include solder, copper, another metal, a metal alloy, or a combination thereof. In some embodiments, the narrower end 409a and wider end 409b of the metal element 409 include copper and the first metal layer 411 includes solder. In some embodiments where the narrower end 409a and wider end 409b of the metal element 409 include copper and the first metal layer 411 includes solder, an intermetallic compound (IMC) may be formed at the interface between the sidewall 409c of the metal element 409 and the first metal layer 411.

By providing the metal element 409 as including copper, the signal transmission speed may be increased as copper has better conductivity. In addition, in some embodiments where the narrower end 409a and wider end 409b of the metal element 409 include copper, the first metal layer 411 includes solder, and an IMC is formed at the interface between the sidewall 409c of the metal element 409 and the first metal layer 411, the oxidation of the metal element 409 can be eased as it is protected by the IMC. Moreover, a process to remove the oxidation layer from the metal element 409 may no longer be necessary before mounting the semiconductor device 400 to another semiconductor device, such as the semiconductor device 200 as illustrated in FIG. 2, which may simplify the mounting process and make the process more cost effective.

In some embodiments, the present disclosure provides a method of manufacturing a semiconductor device including: disposing an insulation layer on a carrier; disposing at least two metal holder materials on the insulation layer, wherein the two metal holder materials are spaced from each other by a distance; aligning the two metal holder materials to a bonding pad disposed adjacent to a surface of a substrate; and bonding the two metal holder materials to the bonding pad. According to the method of the present disclosure, a semiconductor device that can increase the number of electrical connections (i.e., higher I/Os) and at the same time provide a semiconductor device with more reliable electrical connections and at the same time satisfy the miniaturization requirement may be successfully obtained.

FIGS. 5A-5H illustrate a method of manufacturing a semiconductor device such as the semiconductor device of FIG. 2.

Figure 5A:
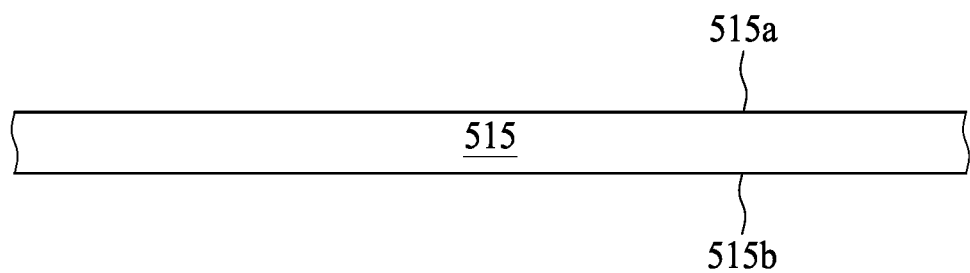
FIG. 5A, FIG. 5B, FIG. 5C, FIG. 5D, FIG. 5E, FIG. 5F, FIG. 5G, and FIG. 5H illustrate a method of manufacturing a semiconductor device such as the semiconductor device of FIG. 2.

Referring to FIG. 5A, a carrier 515 is provided. The carrier 515 has a first carrier surface 515a and a second carrier surface 515b opposite to the first carrier surface 515a.

Figure 5B:
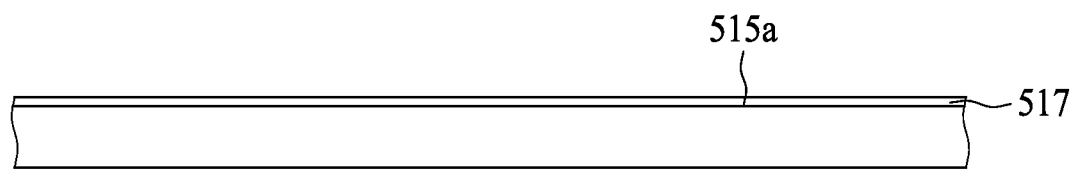

Referring to FIG. 5B, a first insulation layer 517 is disposed adjacent to the first carrier surface 515a of the carrier 515. In some embodiments, the first insulation layer 517 is disposed on (e.g., in physical contact with) the first carrier surface 515a of the carrier 515. The first insulation layer 517 may be disposed by a lamination technique, a coating technique, or other suitable techniques.

Figure 5C:
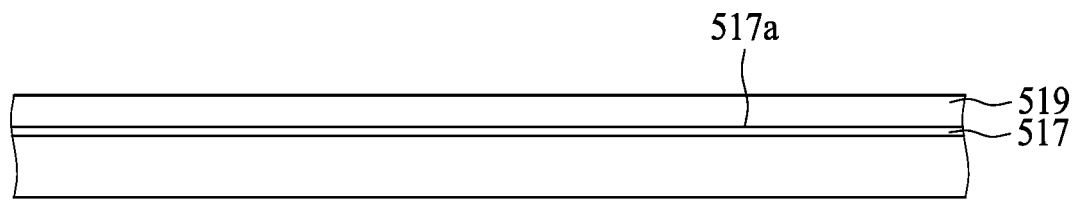

Referring to FIG. 5C, a second insulation layer 519 is disposed adjacent to a surface 517a of the first insulation layer 517. In some embodiments, the second insulation layer 519 is disposed on (e.g., in physical contact with) the surface 517a of the first insulation layer 517. The second insulation layer 519 may be disposed by a lamination technique, a coating technique, or other suitable techniques.

Figure 5D:
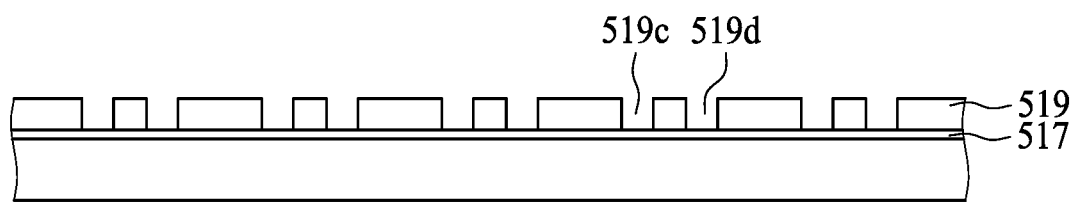

Referring to FIG. 5D, the second insulation layer 519 is patterned to define at least two openings 519c, 519d that are spaced from each other by a distance and expose the first insulation layer 517. In some embodiments, the openings 519c, 519d are formed by, for example, a combination of photolithography, etching, or other suitable techniques.

Figure 5E:
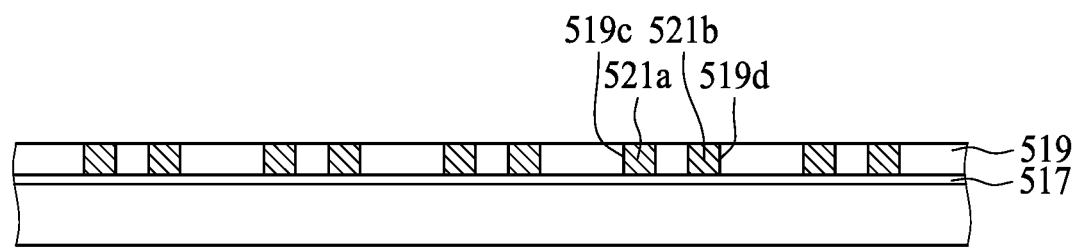

Referring to FIG. 5E, at least two metal holder materials 521a, 521b are disposed in the openings 519c, 519d of the second insulation layer 519. The openings 519c, 519d of the second insulation layer 519 may be filled up with the metal holder materials 521a, 521b. In some embodiments, the metal holder materials 521a, 521b are disposed by, for example, a printing technique, a plating technique, or other suitable techniques.

Figure 5F:
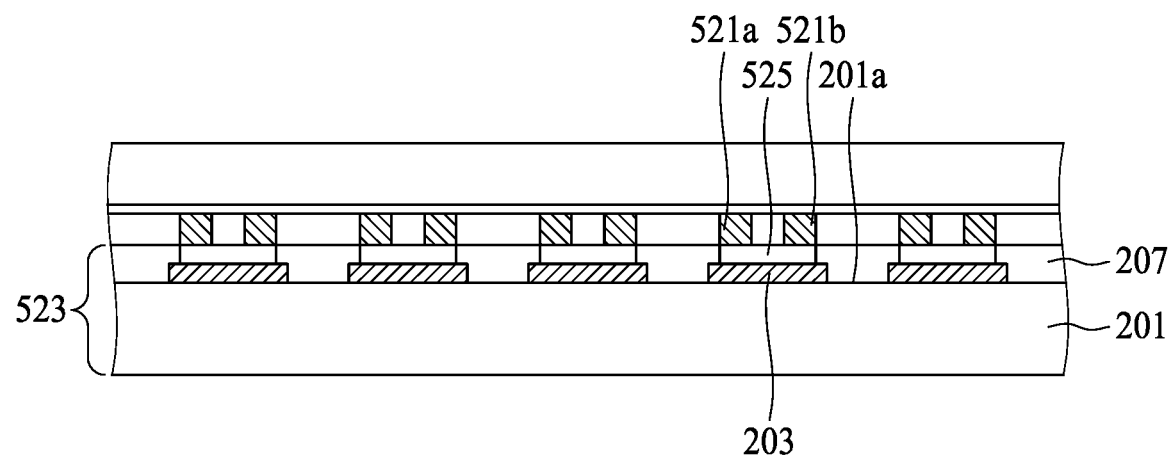

Referring to FIG. 5F, the two metal holder materials 521a, 521b are aligned to a first bonding pad 203 disposed adjacent to a first top surface 201a of a first substrate 201 of a semiconductor device 523. The two metal holder materials 521a, 521b, the first bonding pad 203, and the first insulation layer 207 may define a space 525.

Figure 5G:
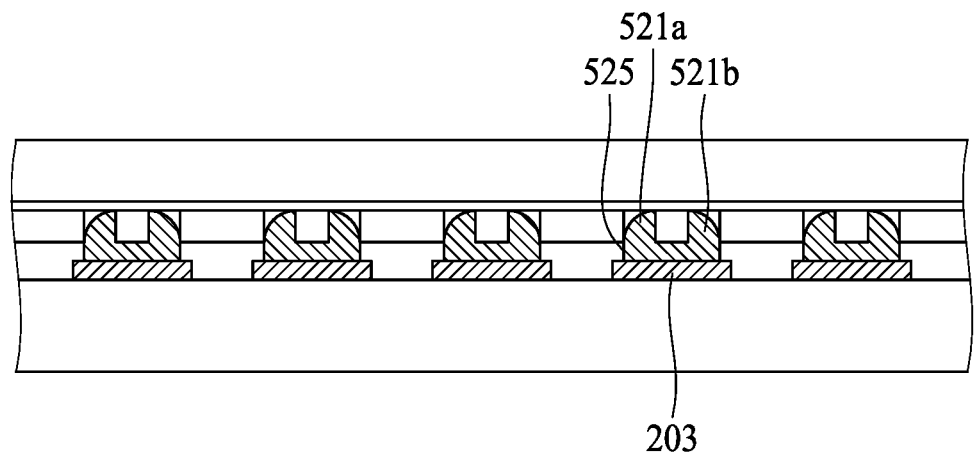

Referring to FIG. 5G, the two metal holder materials 521a, 521b are bonded to the first bonding pad 203. The two metal holder materials 521a, 521b may be bonded to the first bonding pad 203 by reflowing the two metal holder materials 521a, 521b and filling up the space 525 with them.

Figure 5H:
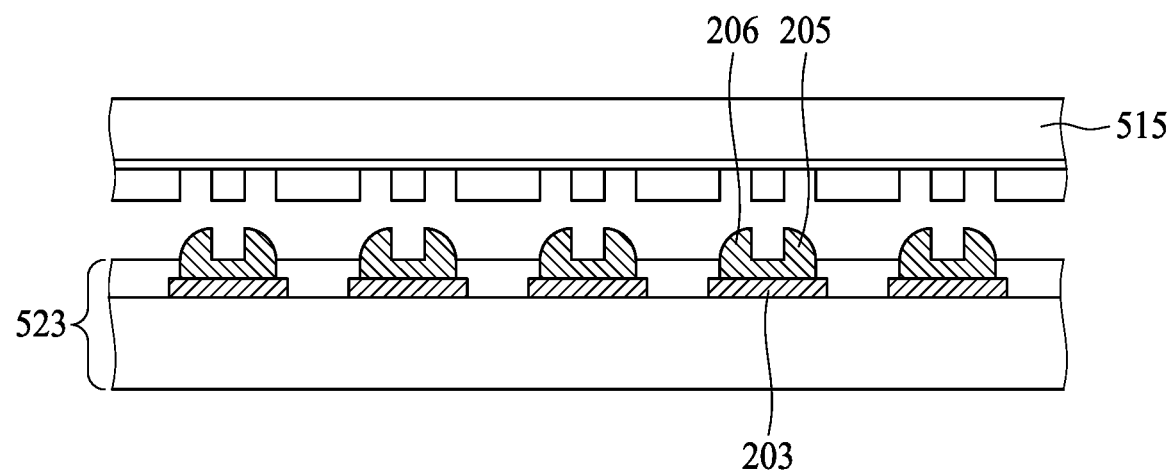

Referring to FIG. 5H, the carrier 515 is removed from the semiconductor device 523 and a metal holder 205 having a sidewall 206 is disposed on the first bonding pad 203 of the semiconductor device 523. Subsequently, a semiconductor device (e.g., a semiconductor device 200 as is illustrated in FIG. 2) may be obtained.

FIGS. 6A-6H illustrate a method of manufacturing a semiconductor device such as the semiconductor device 300 of FIG. 3.

Figure 6A:
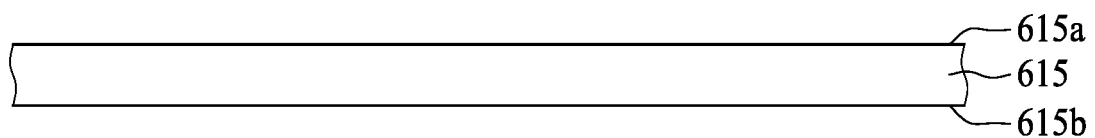
FIG. 6A, FIG. 6B, FIG. 6C, FIG. 6D, FIG. 6E, FIG. 6F, FIG. 6G, and FIG. 6H illustrate a method of manufacturing a semiconductor device such as the semiconductor device of FIG. 3.
Figure 6B:
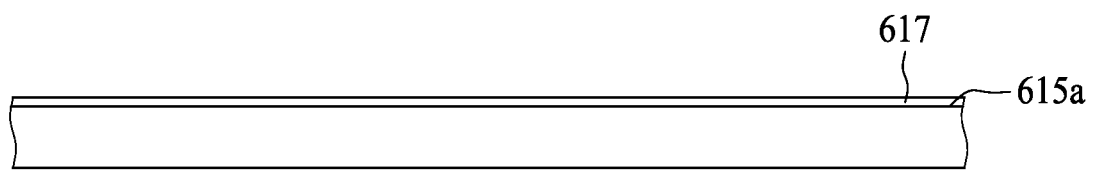
Figure 6C:
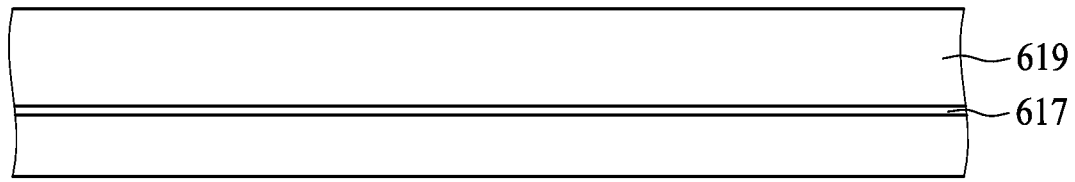

Referring to FIG. 6A-6C, the processes illustrated in FIG. 6A-6C for providing the carrier 615, the first insulation layer 617, and the second insulation layer 619 are similar to those illustrated in FIG. 5A-5C, which are not described repeatedly for brevity.

Figure 6D:
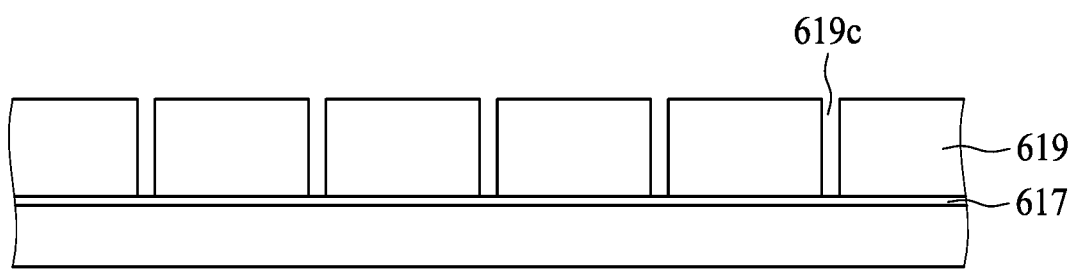

Referring to FIG. 6D, the second insulation layer 619 is patterned to define at least one opening 619c exposing the first insulation layer 617. In some embodiments, the opening 619c is formed by, for example, a combination of photolithography, etching, or other suitable techniques.

Figure 6E:
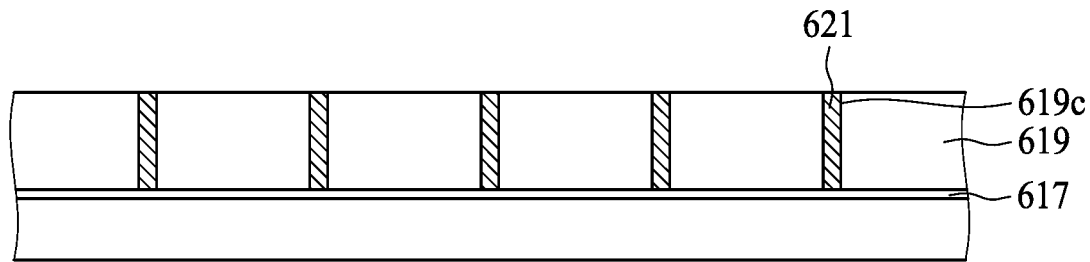

Referring to FIG. 6E, at least one metal element material 621 is disposed in the opening 619c of the second insulation layer 619. The opening 619c of the second insulation layer 619 may be filled up with the metal element material 621. In some embodiments, the metal element material 621 is disposed by, for example, a printing technique, a plating technique, or other suitable techniques.

Figure 6F:
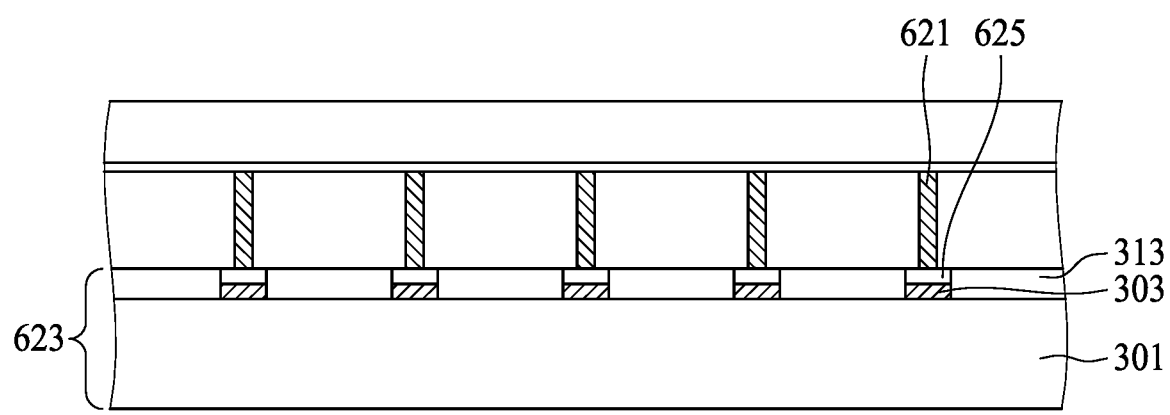

Referring to FIG. 6F, the metal element material 621 is aligned to a second bonding pad 303 disposed adjacent to a second top surface 301a of a second substrate 301 of a semiconductor device 623. The metal element material 621, the bonding pad 303, and the second insulation layer 313 may define a space 625.

Figure 6G:
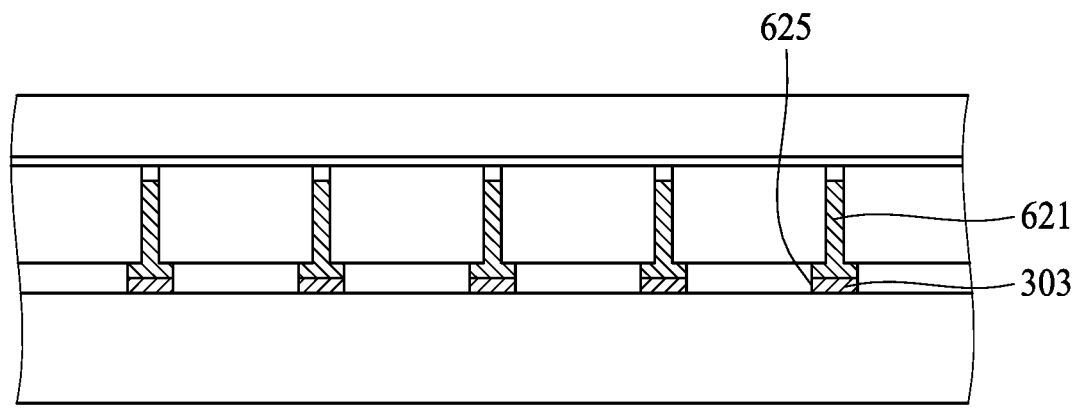

Referring to FIG. 6G, the metal element material 621 is bonded to the second bonding pad 303. The metal element material 621 may be bonded to the second bonding pad 303 by reflowing the metal element material 621 and filling up the space 625 with it.

Figure 6H:
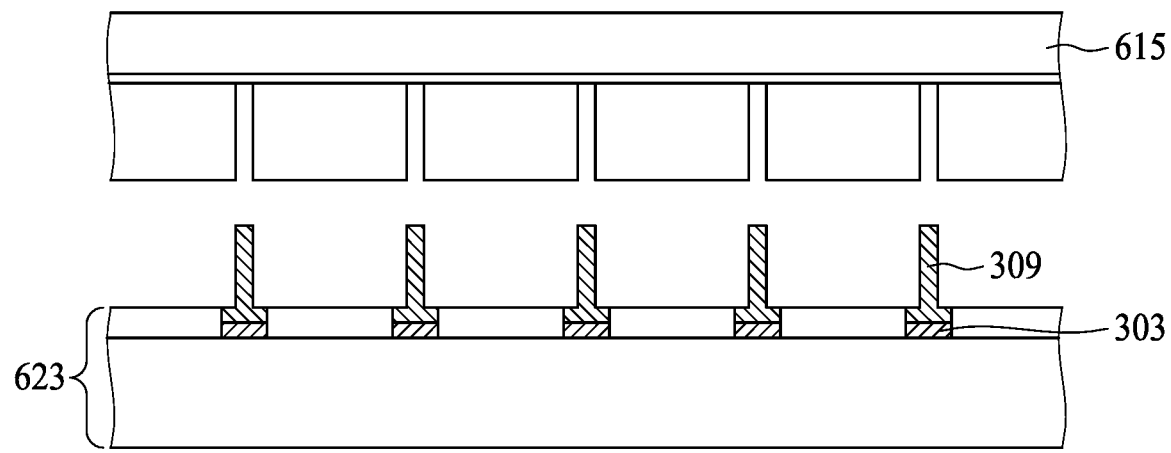

Referring to FIG. 6H, the carrier 615 is removed from the semiconductor device 623 and a metal element 309 having a T-like shape is disposed on the second bonding pad 303 of the semiconductor device 623. Subsequently, a semiconductor device (e.g., a semiconductor device 300 as is illustrated in FIG. 3) may be obtained.

FIGS. 7A-7H illustrate a method of manufacturing a semiconductor device such as the semiconductor device 400 of FIG. 4.

Referring to FIG. 7A-7E, the processes illustrated in FIG. 7A-7E for providing the carrier 715, the first insulation layer 717, the second insulation layer 719, and the first metal material 721 are similar to those illustrated in FIG. 6A-6E, which are not described repeatedly for brevity.

Figure 7A:
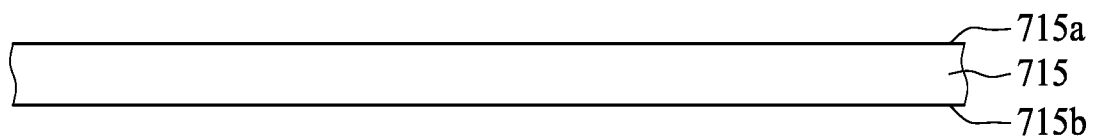
FIG. 7A, FIG. 7B, FIG. 7C, FIG. 7D, FIG. 7E, FIG. 7F, FIG. 7G, and FIG. 7H illustrate a method of manufacturing a semiconductor device such as the semiconductor device of FIG. 4.
Figure 7B:
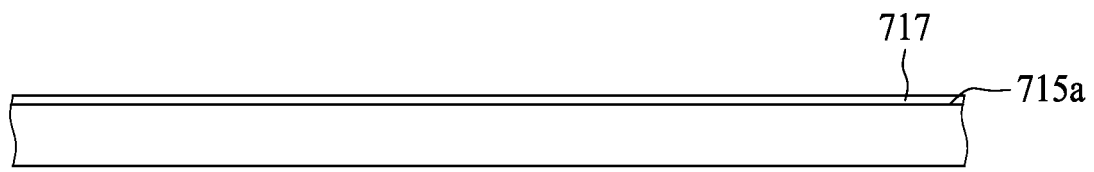
Figure 7C:
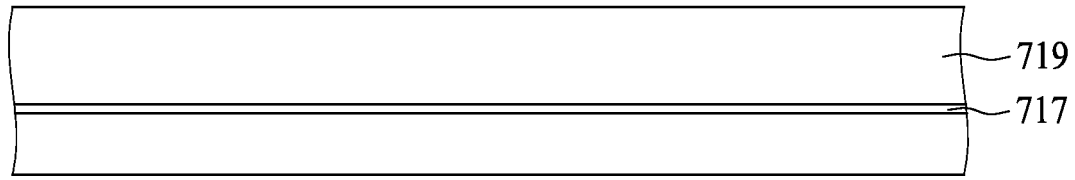
Figure 7D:
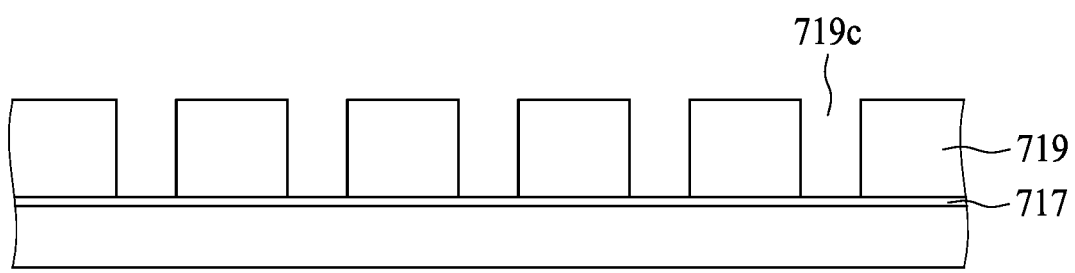
Figure 7E:
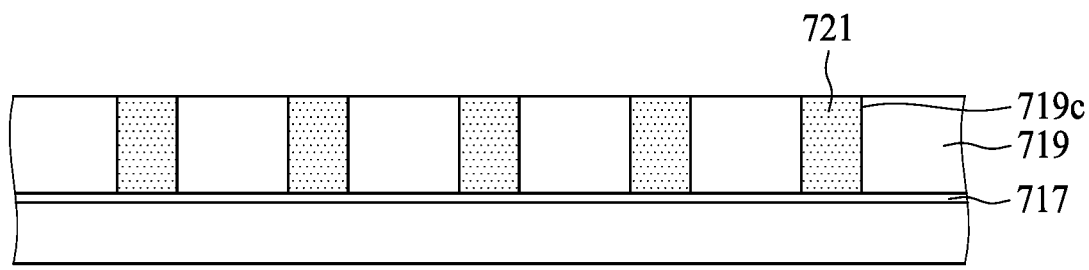
Figure 7F:
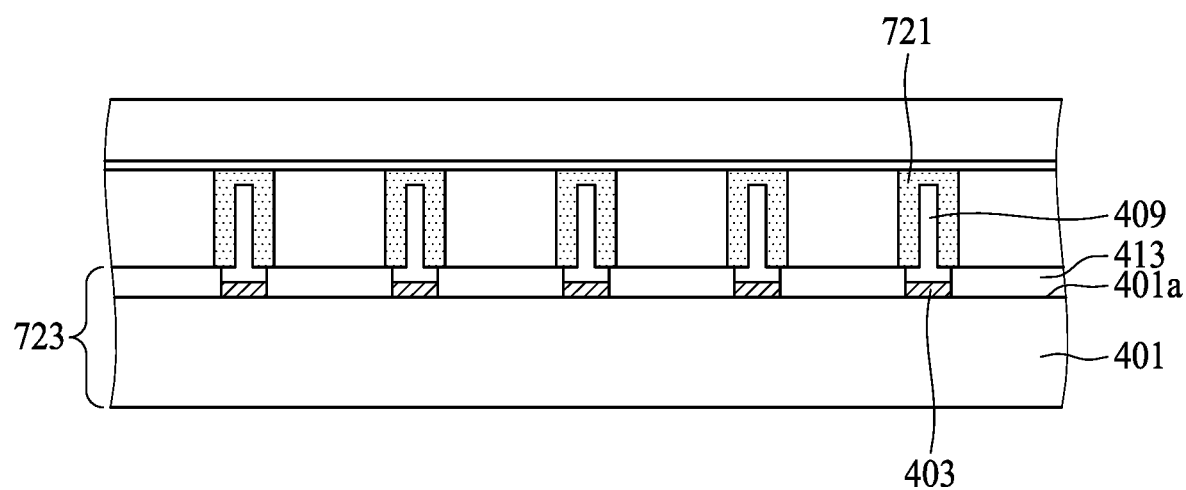

Referring to FIG. 7F, the first metal material 721 is aligned to a second bonding pad 403 disposed adjacent to a second top surface 401a of a second substrate 401 of a semiconductor device 723. At least one metal element 409 is disposed adjacent to the second bonding pad 403 of the semiconductor device 723. In some embodiments, the metal element 409 is disposed on (e.g., in physical contact with) the second bonding pad 403. Subsequently, the metal element 409 is introduced into the first metal material 721. In some embodiments, the metal element 409 is introduced into the first metal material 721 when the first metal material 721 is in a fluid state. In some embodiments, the first metal material 721 may be in a fluid state by a heating, reflowing, or other suitable techniques.

Figure 7G:
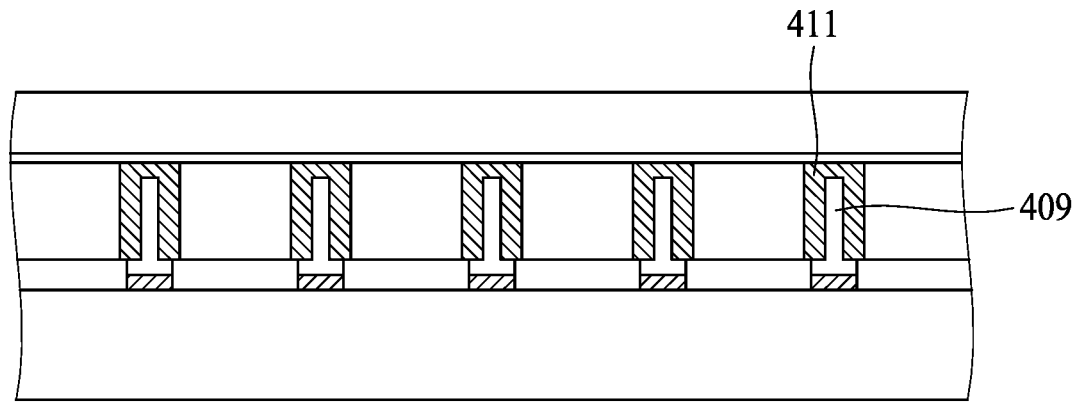

Referring to FIG. 7G, a metal element 409 surrounded by a first metal layer 411 may be formed after the first metal material 721 solidifies. In some embodiments, the first metal material 721 may be solidified by a cooling technique or other suitable techniques.

Figure 7H:
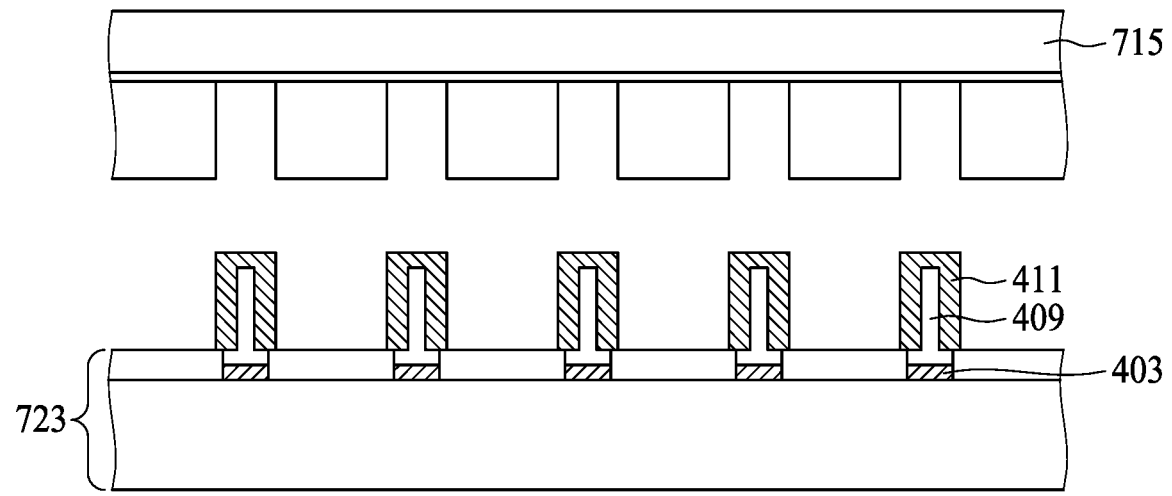

Referring to FIG. 7H, the carrier 715 is removed from the semiconductor device 723 and a metal element 409 surrounded by a first metal layer 411 is disposed on the second bonding pad 403 of the semiconductor device 723. Subsequently, a semiconductor device (e.g., a semiconductor device 400 as is illustrated in FIG. 4) may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the later component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
a substrate having a surface, the substrate including at least one bonding pad disposed adjacent to the surface; and
a metal holder disposed adjacent to the bonding pad,
wherein the metal holder has a sidewall, the sidewall has an inner surface and an outer surface opposite to the inner surface, and the outer surface has a curved surface and a flat surface, wherein the curved surface connects to the flat surface at a turning point from a cross-sectional view.

2. The semiconductor device of claim 1, wherein the metal holder comprises a cavity.

3. The semiconductor device of claim 1, wherein the outer surface slopes down toward the surface of the substrate.

4. The semiconductor device of claim 1, wherein the metal holder has a pincer-like shape.

5. The semiconductor device of claim 1, further comprising an insulation layer disposed adjacent to the surface of the substrate, wherein the insulation layer defines an opening accommodating the metal holder and a top surface of the insulation layer contacts the turning point.

6. The semiconductor device of claim 1, further comprising an insulation layer disposed adjacent to the surface of the substrate, wherein the insulation layer defines an opening accommodating the metal holder and a top surface of the insulation layer is substantially perpendicular to the flat surface.

7. The semiconductor device of claim 1, further comprising an insulation layer disposed adjacent to the surface of the substrate, wherein the insulation layer defines an opening accommodating the metal holder and a top surface of the metal holder connecting to the inner surface is at substantially the same level with a top surface of the insulation layer.

8. The semiconductor device of claim 1, further comprising an insulation layer disposed adjacent to the surface of the substrate, wherein the insulation layer defines an opening accommodating the metal holder and the flat surface contacts the insulation layer.

9. A semiconductor device, comprising:
a first substrate having a surface, the first substrate including at least one bonding pad disposed adjacent to the surface;
a metal element disposed adjacent to the bonding pad, wherein the metal element is adapted to fit a metal holder disposed adjacent to a surface of a second substrate, and the metal element comprises a narrower portion and a wider portion; and
a first metal layer covering the narrower portion, wherein a width of the first metal layer is greater than a width of the wider portion of the metal element.

10. The semiconductor device of claim 9, wherein the metal holder comprises a cavity and the cavity has a width no less than that of the metal element.

11. The semiconductor device of claim 9, wherein the metal holder comprises a cavity and the cavity has a width no less than that of the metal element and the first metal layer.

12. The semiconductor device of claim 9, wherein the metal element includes copper and the first metal layer includes solder.

13. The semiconductor device of claim 9, wherein the metal element includes solder.

14. The semiconductor device of claim 9, further comprising an insulation layer disposed adjacent to the surface of the first substrate, wherein the insulation layer defines an opening exposing a portion of the bonding pad, and the metal element is disposed in the opening of the insulation layer.

15. The semiconductor device of claim 9, wherein the first metal layer contacts a top surface of the wider portion of the metal element.

16. The semiconductor device of claim 9, further comprising an insulation layer disposed adjacent to the surface of the first substrate, wherein the insulation layer defines an opening accommodating the metal element, and the first metal layer contacts the insulation layer.

17. A method for manufacturing a semiconductor device, comprising:
disposing an insulation layer on a carrier;
disposing at least two metal holder materials on the insulation layer, wherein the two metal holder materials are spaced from each other by a distance;
aligning the at least two metal holder materials to a single bonding pad disposed adjacent to a surface of a substrate; and
bonding the at least two metal holder materials to the single bonding pad.

18. The method of claim 17, wherein the step of bonding the at least two metal holder materials to the single bonding pad comprises reflowing the at least two metal holder materials.

19. The method of claim 17, wherein the at least two metal holder materials include solder.

20. The method of claim 17, wherein the step of aligning the at least two metal holder materials to the single bonding pad comprises: disposing the insulation layer adjacent to the surface of the substrate so the insulation layer, the single bonding pad, and the at least two metal holder materials define a space.

* * * * *